United States Patent [19]
Damani et al.

[11] Patent Number: 6,031,987
[45] Date of Patent: Feb. 29, 2000

[54] OPTIMISTIC DISTRIBUTED SIMULATION BASED ON TRANSITIVE DEPENDENCY TRACKING

[75] Inventors: Om P. Damani; Vijay K. Garg, both of Austin, Tex.; Yi-Min Wang, Bellevue, Wash.

[73] Assignee: AT&T, New York, N.Y.

[21] Appl. No.: 09/059,042

[22] Filed: Apr. 13, 1998

Related U.S. Application Data

[60] Provisional application No. 60/045,755, May 6, 1997.

[51] Int. Cl.[7] .................................................. G06F 9/44
[52] U.S. Cl. .............................. 395/500.38; 395/500.34; 395/568; 395/800.28; 709/201; 714/741
[58] Field of Search .................. 395/500.34, 500.35, 395/500.38, 500.48, 800.28, 683, 568, 553, 557; 709/201; 371/27, 23; 714/741, 716

[56] References Cited

U.S. PATENT DOCUMENTS

| | | | |
|---|---|---|---|
| 4,901,260 | 2/1990 | Lubachevsky | 364/578 |
| 4,914,612 | 4/1990 | Beece et al. | 364/578 |
| 5,278,778 | 1/1994 | Akimoto et al. | 364/578 |
| 5,377,201 | 12/1994 | Chaksadhar et al. | 371/23 |
| 5,442,772 | 8/1995 | Childs et al. | 395/500 |
| 5,617,561 | 4/1997 | Blaauw et al. | 395/500 |
| 5,630,047 | 5/1997 | Wang | 395/182.13 |
| 5,649,164 | 7/1997 | Childs et al. | 395/500 |
| 5,652,871 | 7/1997 | Steinman et al. | 395/500 |
| 5,794,005 | 8/1998 | Steinman | 395/500 |
| 5,801,938 | 9/1998 | Kalantery | 364/131 |
| 5,832,272 | 11/1998 | Kalantery | 395/706 |

OTHER PUBLICATIONS

Bennett, B. S., *Simulation Fundamentals*, Prentice Hall, 1995, Chapter 10, pp. 291–296.

Fujimoto, R. M., "Parallel Discrete Event Simulation," *Communications of the ACM*, vol. 33, No. 10, Oct. 1990, pp. 31–53.

Jefferson, D. R., "Virtual Time," *ACM Transactions on Programming Languages and Systems*, vol. 7, No. 3, Jul. 1985, pp. 404–425.

Wang, Y. et al., "Distributed Recovery with K–Optimistic Logging," *Proc. IEEE Int'l. Conf. on Distributed Computing Systems*, May 1997, pp. 60–67.

*Primary Examiner*—Kevin J. Teska
*Assistant Examiner*—Thai Phan

[57] ABSTRACT

An optimistic distributed simulation method applicable to event-driven simulation that requires only a single rollback announcement per straggler message, with no need for other simulation processes to announce their roll backs. The method is accomplished by maintaining transitive dependency information between the simulation processes in the form of a simulation vector. The present invention eliminates the need for output queues and also the possibility of multiple roll backs per simulation process and avalanche of anti-messages. Alternatives to reduce blocking and minimize the size of the simulation vectors are also disclosed thereby reducing the overhead requirements for systems with large numbers of logical processes.

34 Claims, 14 Drawing Sheets

OPTIMISTIC DISTRIBUTED SIMULATION BASED ON TRANSITIVE DEPENDENCY TRACKING

This application claims the benefit of the provisional application titled "Optimistic Distributed Simulation Based on Transitive Dependency Tracking," Ser. No. 60/045,755, filed May 6, 1997.

FIELD OF THE INVENTION

The present invention relates to the field of event simulation, and in particular to event-driven optimistic simulation where only a single rollback announcement per straggler message is required.

BACKGROUND OF THE INVENTION

In distributed simulation, various techniques are used to describe, model and simulate a collection of physical subsystems and objects that comprise a physical system. A critical aspect of that simulation is understanding and representing the time-phased interaction of individual physical subsystems on each other within the physical system. Changes in the states of the physical subsystems result from these time-phased interactions. In distributed simulation, logical processes (LPs) are commonly used to characterize or mimic the time-phased interaction that occurs among physical subsystems in the physical system. This includes simulation by the LP of the output states of the associated or corresponding physical subsystems.

There are two general types of distributed simulation. One is typically called time-stepped, the other is typically called event-driven. In event-driven distributed simulation, the state of the physical subsystem results from interaction only at some special instant or event, and the happening of those events can only be determined through the simulation itself. Thus, the drive of the simulation is by means of these events, hence, the simulation being termed event-driven. The present invention is most concerned with the later type of event-driven simulation.

Typically, a sequential event-driven simulation employs a queue of events, in which events are arranged in sequential order of the time at which they must happen. At simulation time T, the simulator iterates on the next unprocessed event with the lowest or earliest time stamp. At each iteration, the simulator picks the earliest event in the queue that is schedule for the corresponding LP and the LP executes the event, thereby updating the state of the LP based on the event. As a result of these event executions and associated state changes by all LPs, new events are created which are inserted in the queue according to the time they must be executed.

As previously discussed, to accurately simulate the physical subsystem, events must be processed in a sequential order of time. The difficulty is that with a distributed simulation it is easily conceivable that an LP receives, for inclusion in its queue, an event scheduled for a time that has already passed in the local simulation. This late event has been termed a "straggler" and creates a "causality error." With a causality error, a system will improperly affect the past. This is unacceptable and results in a flawed simulation.

With a distributed simulation of a complex physical system comprising physical subsystems that interact in non-sequential fashion, provision must be made to either avoid causality errors or accommodate and correct the errors. Multiple techniques are known in the art and used to avoid or accommodate stragglers. Conservative simulation, as known in the art, avoids stragglers thus ensuring that the current state will never need to roll back. As similarly known in the art of distributed simulation, optimistic simulation ensures that should a straggler message occur, the proper state is always recoverable.

In conservative simulations, a logical process is only allowed to advance in simulation time when there is no possibility of a straggler message. This constraint slows down the simulation, but there is no possibility of roll back and hence prior state information need not be saved.

One simulation method uses a concept called time warp, based on the Virtual Time paradigm. With time warp, time is somewhat distorted with the simulation advancing based on the interaction of logical processes rather than rigid simulation clock time. In this manner, a simulation advances rapidly when there are few interactions, and more slowly when there are many interactions.

In optimistic simulations, a logical process is allowed to act on events in their event queue until a straggler message is received and identified. On that occurrence, the logical process that received the straggler message typically broadcasts a rollback message to notify other logical processes of the straggler message and sends anti-messages to cancel improperly transmitted messages and stop erroneous computation. When straggler messages occur infrequently, optimistic simulation is very time efficient, allowing the distributed simulation to advance faster than it would under a conservative approach. As known in the field of optimistic simulation with time warp, a single straggler message can cause an avalanche of anti-messages as well as multiple roll backs of each LP. It is further possible, and known in the field, that the system may livelock (LP's keep on rolling back each other and the anti-messages chase the messages in a never ending race).

The techniques known in the art that allow controlled roll back in optimistic simulation to accommodate stragglers, have high message overhead.

It is therefore an advantage and desire to modify the time warp to quickly stop the spread of erroneous computation without requiring output queues and anti-messages. This results in less memory overhead and simple memory management algorithms, with significantly reduced message traffic.

SUMMARY OF THE INVENTION

The present invention features a system and a method whereby a rollback announcement, in response to a straggler message in a distributed simulation, is broadcast only by the LP that receives the straggler message. Other LPs that roll back in response to the rollback announcement send neither a rollback announcement, nor anti-messages. As a result, each LP rolls back at most once in response to the straggler, and the problems of multiple roll back and livelock are avoided. This is accomplished through maintaining and appending transitive dependency information to each inter-LP message in the form of a simulation vector.

In an advantageous embodiment of the present invention, all LP's maintain transitive dependency information. This transitive dependency information includes sufficient information to establish inter-LP dependencies, as well as information on past roll backs, in the form of an incarnation number. On receipt and identification of a straggler message, the receiving LP broadcasts a rollback announcement, which is acknowledged by all LPs. The rollback announcement includes the timestamp of the straggler message and the current incarnation number of the receiving LP. After receiving a rollback announcement, each LP can determine whether or not roll back is required by comparison of the time stamp and incarnation number (as appended to the rollback announcement), to the transitive dependency information (as maintained by each LP). If roll back is required, the LP uses the transitive dependency information to return to an earlier state, such that the straggler message will be properly executed.

Another aspect of the present invention is reduction of the required memory storage overhead needed to track and maintain transitive dependency. This aspect is accomplished through retention of only relevant transitive dependency information. This is advantageous because, unless a provision is made to control or limit the storage of transitive dependency information, the requirement for storage will continue to grow indefinitely as the simulation progresses. In the present invention, this aspect is accomplished by establishing a Global Virtual Time (GVT). GVT is known in the art as a given point in the virtual time of the simulation defined such that no state of any LP will ever be rolled back to a time less than the GVT. In this manner, transitive dependency information for states prior to GVT are no longer relevant to the simulation and thus may be discarded.

An alternate embodiment of the present invention provides for reduced process blocking as required to accommodate roll back. In this embodiment, the LP receiving the straggler message and broadcasting the rollback announcement blocks action on all further messages until all other LPs have acknowledged receipt of the rollback announcement. As a result, the simulation, as regards the LP that received the straggler, is blocked from advancement. In this alternate embodiment, the blocking occurs at the other LP's rather than the LP receiving the straggler message. In this manner the receiving LP is able to recommence simulation immediately after accommodating the straggler message, without the need to wait for acknowledgment receipt of the rollback message from all other LPs.

An alternative embodiment of the present invention provides for reduced message overhead by grouping LPs into clusters and appending different transitive dependency information to inter-cluster messages based on whether the cluster contains optimistic or conservative simulation LPs.

These and other advantages of the present invention will be apparent to those of ordinary skill in the art by reference to the following detailed description and the accompanying drawings.

DETAILED DESCRIPTION OF THE EMBODIMENTS

The following detailed description provides an example of the present invention and a detailed description of steps that will accomplish the invention objectives.

However, the examples provided are merely those, and individuals of ordinary skill in the art will realize that other alternatives or equivalents will also accomplish the objectives without deviating from the overall scope of the present invention. In particular, though a series of flow charts and example code are provided in the detailed description and figures, they are for illustration only and those of ordinary skill will know that certain steps may be executed in different order or through different instructions without deviating from the intent and objects of this present invention.

Vector clocks, known in this field of art, are vectors of size n where n is the number of processes in the system. Each vector entry is a timestamp that typically counts the number of sending and receiving events of a process. In the present invention, the vector clock as known in the art is modified to form a Simulation Vector (SV) as described below. To maintain causality in spite of roll backs, the present invention expands each message entry to include both a timestamp and an incarnation number, thus forming an SV.

In the present invention, the SV has properties similar to a vector clock. By maintaining transitive dependency information for all LP's, in the form of an SV, and comparing that transitive dependency information with the SV appended to a message, the LP can detect the causal dependencies between non-rolled back states. In this manner, the present invention can identify and accommodate straggler messages, and ensure a reliable roll back of the affected LP states.

In addition to an SV, each LP also maintains an incarnation end table (IET). For LP $P_i$, the $j^{th}$ component of the IET is a set of entries of the form (k, ts) where ts is the timestamp of the straggler message that caused the roll back of the $k^{th}$ incarnation of $P_j$. All states of the $k^{th}$ incarnation of $P_j$ with timestamp greater than ts have been rolled back. Thus, the IET allows an LP to detect orphan messages.

Figure 1:
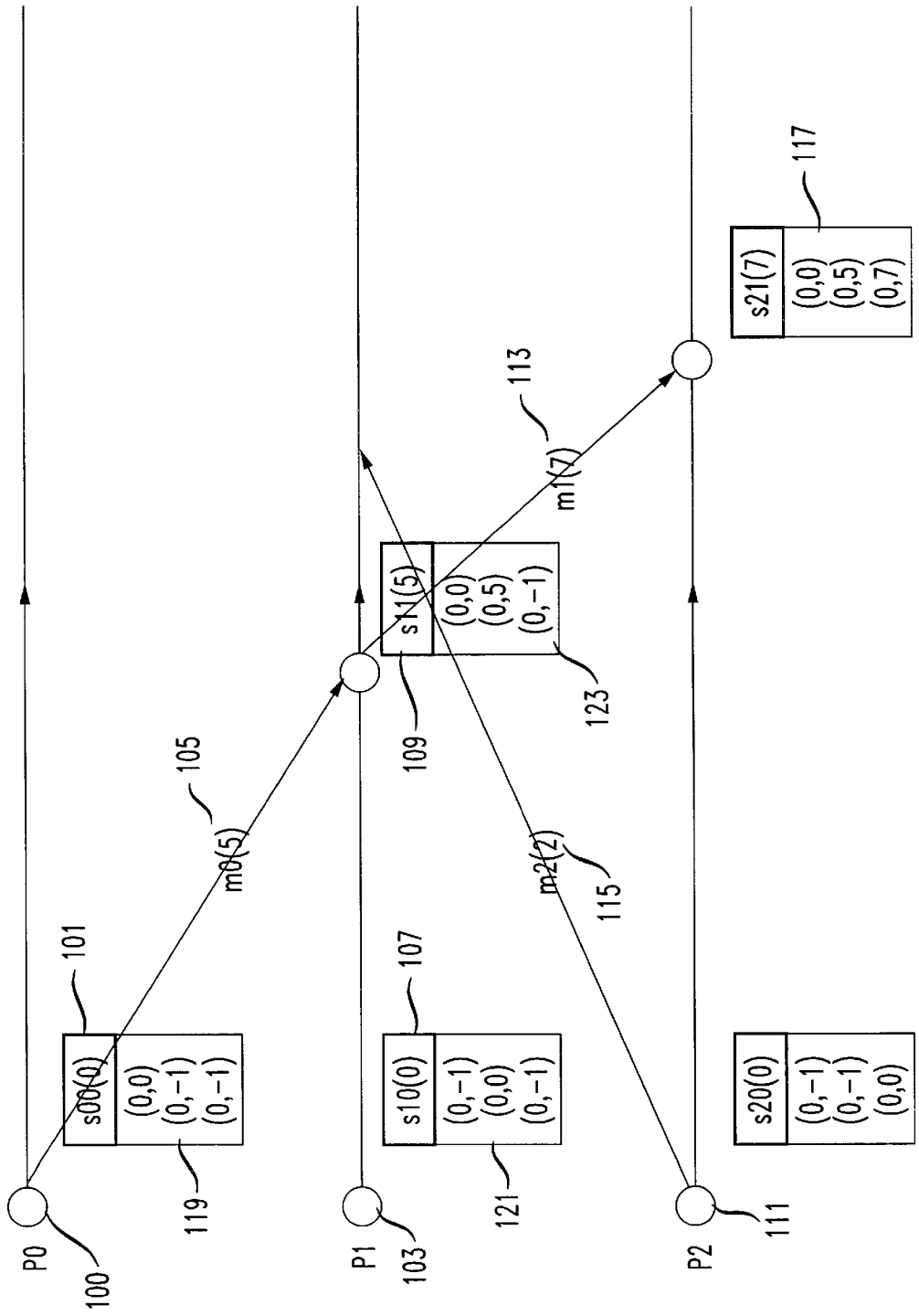
FIG. 1 is a Pre-straggler message computation in a distributed simulation according to the present invention.
Figure 2:
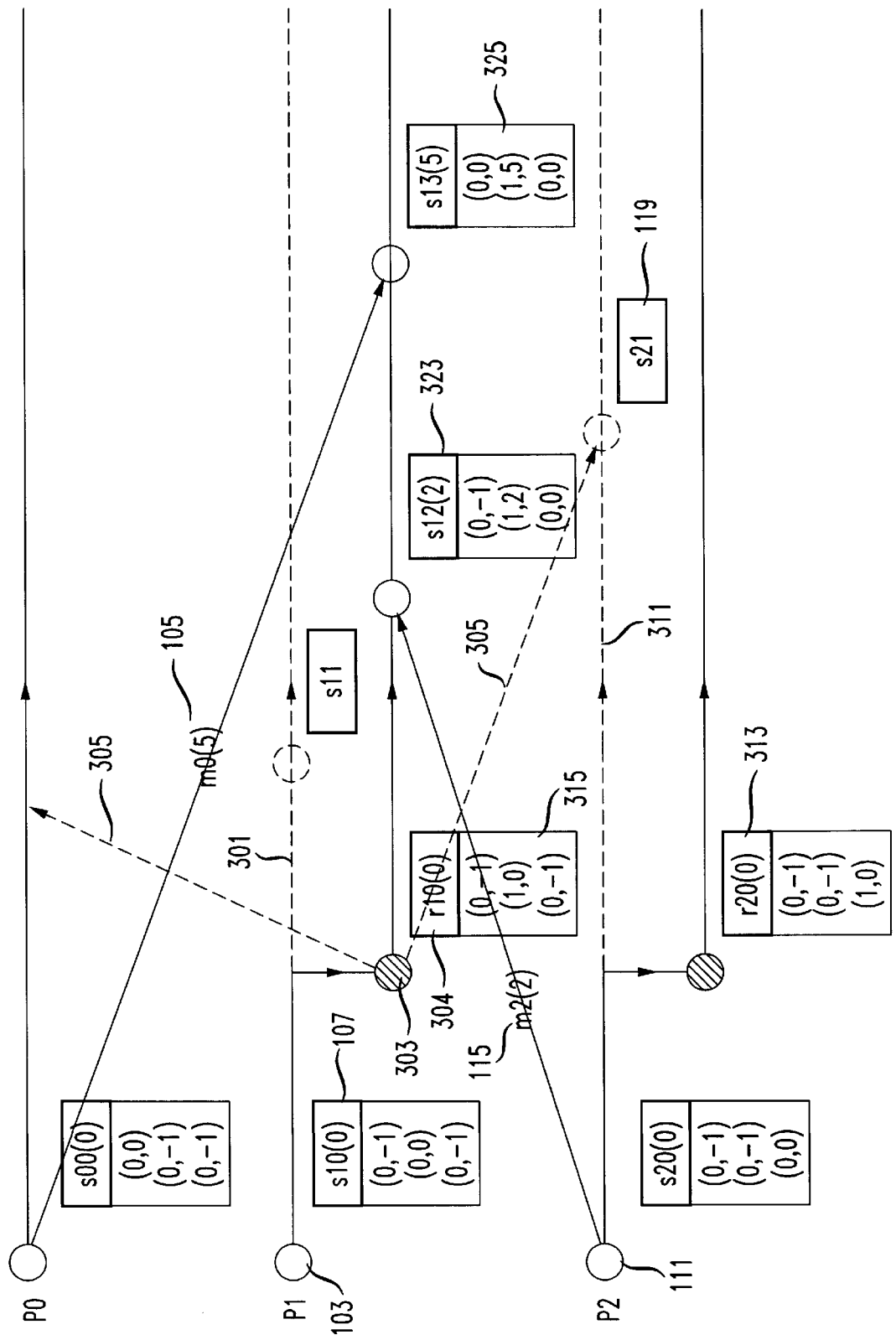
FIG. 2 is a Post-straggler message computation in a distributed simulation according to the present invention.

Referring now to the figures in detail where like reference numerals indicate like elements throughout the several views, FIGS. 1 and 2 illustrate a typical distributed simulation of an advantageous embodiment of the present invention. Numbers shown in parentheses are either virtual times of states or the virtual times of scheduled events carried by messages. Solid lines indicate useful computations, while dashed lines indicate rolled back computations.

As an example of inter-LP message transactions, in FIG. 1, LP P0 100 at state's00 101 schedules an event for P1 103 at time 5 by sending message m0 105. P1 optimistically executes this event, resulting in a state transition from s10 107 to s11 109, and schedules an event for P2 111 at time 7 by sending message m1 113. Then P1 receives message m2 115 which schedules an event at time 2. This message m2 is detected by P1 as a straggler message.

Determination of whether the received message is a straggler message requires comparison of the timestamp of the received message with the current simulation time of the LP. If the timestamp of the received message is earlier than the current simulator time of the LP, the message is a straggler message. Otherwise, the message may be added to the queue and processed in turn.

In FIG. 1, when P1 receives message m2, the current simulation time of P1 is time 5, or later. However, m2 was to be executed at time 2, therefor P1 identifies m2 as a straggler message.

In the example, to accommodate the straggler message m2, and correct the simulation, P1 must roll back prior to time 2 and process m2. However, the straggler message m2, with timestamp 2, was received after simulator time 5, thus requiring reversal of the event at time 5 (which was accomplished on receipt of message m0). Receipt of the straggler message by P1 also requires P1 to inform other LPs that are dependent on P1 of the roll back, in order for them to also roll back if they depend on P1's state. After sending the rollback announcement, P1 will then roll back to the earliest event prior to time 2. In the example, this earliest event is the event at time 0.

Identification of a straggler message and roll back is accomplished through a simulation vector. In FIG. 1, a distributed simulation with three LPs is illustrated. The LPs (P0, P1 and P2) 101, 103, and 111 are all capable of interaction between each other as represented by inter-LP messages, and the contents of their respective simulation vectors are illustrated in a rectangle that is associated with each state. The simulation vector for each LP consist of an ordered pair corresponding to each LP in the system. As illustrated in FIG. 1, three LPs comprise the example simulation, therefore three ordered pairs are illustrated for each SV. As further illustrated in FIG. 1, for state s00 at time (0) 101 the first ordered pair (0,0) of the SV 119 corresponds to P0, the second ordered pair (0,-1) corresponds to P1 and the last ordered pair (0,-1) corresponds to P2. Within the ordered pair, the first position corresponds to the incarnation number, and the second position of the ordered pair corresponds to the timestamp.

As an example of the timestamp, in FIG. 1, the -1 timestamps at state s00 101 indicate that P0 has no transitive dependency on either P1 or P2. As a further example, for state s11 at time (5) 109, the timestamp entry for the first ordered pair (0,0) has changed from the earlier value of -1 121 to indicate that s11 is transitively dependent on P0 state s00 at time 0. However, in contrast, since the timestamp entry for the 3rd ordered pair (0,-1) remains -1, P1 is not yet transitively dependent on P2.

In FIG. 1, as an example of the incarnation number, consider the SV 121 of P1 103 at time 0. The second ordered pair corresponding to P1 is (0, 0) and the incarnation number is the first entry of the ordered pair, therefore 0 indicates that LP P1 has not rolled back. Referring now to FIG. 2, the SV 315 of P1 303 after roll back is (1,0). Thus, the incarnation number 1 in the first position of the SV indicates the number of times that P1 has rolled back. Throughout FIG. 1, the incarnation numbers (the first position of the ordered pair) are all 0, as there has been no roll back of any state. In FIG. 2, the incarnation number for P2 at state r20 313 is 1 indicating that LP P2 has rolled back.

As a further explanation, for the SV of a logical process $P_i$, the timestamp in the $i^{th}$ entry at a given point corresponds to the virtual time of $P_i$ at that point. The timestamp in the $j^{th}$ entry corresponds to the virtual time of the latest state of $P_j$ on which $P_i$ depends. The incarnation number in the $i^{th}$ entry is equal to the number of times $P_i$ rolls back. The incarnation number in the $j_{th}$ entry is equal to the highest incarnation number of $P_j$ on which $P_i$ depends. For example, entry en is a tuple (incarnation v, timestamp t). A lexicographical ordering is as follows:

$$en_1 < en_2 \equiv (v_1 < v_2) \vee [(v_1 = v_2) \wedge (t_1 < t_2)].$$

In the normal process of managing inter-LP messages to maintain transitive dependency information, the SV of the sending LP is appended to the inter-LP message. The receiving LP updates it current SV with the received message's SV by taking a lexicographical maximum. Using FIG. 1 as an illustration, P0 100 at state s00 101 sent inter-LP message m0 105 with an appended SV (0,0; 0,-1; 0,-1) 119 and message time 5. On receipt of m0, P1 103 takes the maximum of the received SV 119 and its own SV (0,-1; 0,0; 0,-1) 121. The result is (0,0; 0,0; 0,-1). After taking this lexicographical maximum, P1 updates its virtual time to that of the timestamp on the received message. In this case, the timestamp is 5, indicating that m0 is to be executed at simulation time 5. After this update, P1's SV at state s11 109 is (0,0; 0,5; 0,-1) 123.

As a more detailed explanation of the process, if $P_i$ schedules an event for $P_j$ at time t, $P_i$ attaches its current SV to the message carrying the event to $P_j$. Virtual time of message m denotes the scheduled time of the event. If m is neither an orphan message nor a straggler message, it is kept in the incoming queue. When the event corresponding to m is executed, $P_j$ updates its SV with m's SV by taking the componentwise lexicographical maximum. Then $P_j$ updates its virtual time (denoted by the $j^{th}$ timestamp in its SV) to the virtual time of m. A more formal description of the SV protocol follows:

TABLE 1

LP $P_i$:
    type entry = (int inc, int ts)
                /*incarnation, timestamp*/
    var sv:     array [0..n−1] of entry
    Initialize:
    ∀ j: sv[j].inc = 0; sv[j].ts = −1;
    sv[i].ts = 0;
    Send_message (m):
    m.sv = sv;
    m.ts = time at which m should be executed;
    send (m.data, m.ts, m.sv);
    Execute_message (m.data, m.ts, m.sv):
    /* $P_i$ executes event scheduled by m*/
    ∀ j: sv[j] = max (sv[j], m.sv[j]);
    sv[i].ts = m.ts;
    Rollback:
    /* State s is restored. So, sv = s.sv */
    sv[i].inc ++;

Referring now to FIG. 2, execution after the arrival of the straggler message m2 (115 in FIG. 1) is illustrated. In order to execute m2, P1 103, the LP that received the straggler, must roll back 301 to a time before time (2). In the example, the only valid state for P1 prior to time (2) is the state s10 107 at time (0). Therefore P1 restores s10, takes action for maintaining the correctness of the simulation and restarts from state r10 304. (The actions required for maintaining the correctness of the simulation include broadcasting a rollback announcement and then incrementing the incarnation number.) After rolling back to state s10, P1 broadcasts a rollback announcement 305 (as shown by dotted arrows). The rollback announcement includes the time of the straggler message, here time (2) in the example, and also includes the incarnation number of the LP receiving the straggler message, here 0 in the example. In the example, the incarnation number was 0 before receipt of straggler message m2.

Thus, after broadcast of the rollback announcement, the incarnation number of P1 is incremented by 1 from 0 to 1.

Following broadcast of the rollback announcement and incrementing the incarnation number, P1 blocks execution of any more messages until receipt of acknowledgment from all other LP's. After the blocking is removed, P1 then acts on m2 115 which was scheduled for time 2. On completion of the m2 actions, the SV of P1 at state s12 is (0,−1; 1,2; 0,0) 323. P1 then acts on m0 105 which was scheduled for time 5. After action on m0, P1's SV at state s13 is (0,0; 1,5; 0,0) 325. Upon receiving P1's rollback announcement, P2 111 at state s21 119 realizes that it is dependent on a rolled back state and so it also rolls back 311, restores state s20, takes actions needed, and restarts from state r20 313. Finally orphan message m1, 113 in FIG. 1, is identified as such and is discarded.

The technique for determining whether an LP ($P_i$), in receipt of a rollback announcement from another LP ($P_j$), is dependent on a rolled back state involves comparison of the timestamp appended to the rollback message and the SV, as maintained at the receiving LP ($P_j$). If the incarnation numbers of the $j^{th}$ entry and the rollback announcement are the same and the timestamp of the $j^{th}$ entry is greater than the received timestamp, then the state of the receiving LP is dependent on a rolled back state and must be rolled back. Otherwise, no roll back is required. An example of this test is:

if(sv[j].inc=v)∧(t<sv[j].ts)

then Rollback(j,(v,t));

as contained in the subroutine Receive_token (v,t) in Table 2.

In the example in FIGS. 1 and 2, before P2 receives the rollback announcement, the SV of n at state s21 is (0,0; 0,5; 0,7) 117. Thus P2 depends on the state of P1 at time (5), as indicated by the timestamp 5 in the second entry of the second pair corresponding to P1. When this SV 117 is compared to the rollback announcement, the incarnation numbers are the same, 0, and the timestamp appended to the rollback announcement, 2, is less than the timestamp corresponding to P1, 5, as currently held at P2. This indicates that state s21 of P2 is transitively dependent on P1 and must therefore roll back to a time prior to time 2. In the example that is time 0 for P2.

The following provides a more rigorous description of the transitive dependency of the present invention, where I, j refer to LP numbers; s, u, w, x, y refer to states; $P_i$ refers to logical process I; s.p refers to the number of the LP to which s belongs, that is s.p=i=>s∈$P_i$; m refers to a message and e refers to an event. To take roll backs into accounts, the "happen before" relations, as described in L. Lamport, Time, Clocks, and the Ordering of Events in a Distributed System. *Communications of the ACM*, vol. 21, no. 7, 58–565, 1978, are extended. For two states s and u, s→u is the transitive closure of the relation defined by the following three conditions:

1. s.p=u.p and s immediately precedes u.
2. s.p=u.p and s is the state restored after a roll back and u is the state after $P_{u.p}$ has taken the actions needed to maintain the correctness of simulation despite the roll backs.
3. s is the sender of a message m and u is the state in which the event scheduled by m is executed.

For example, referring again to FIG. 1, s10→s11, s00→s21, and referring to FIG. 2, s11 ↛ r10. Saying s happened before u is equivalent to saying that u is transitively dependent on s. For the present invention, "actions needed to maintain the correctness of simulation" is the increment of the incarnation number, as described later in the specification. The present invention causes rollback announcements to be sent among LPs, however the rollback announcements do not contribute to the "happen before" relation. Thus, if u receives a rollback announcement from s, u does not become transitively dependent on s due to the rollback announcement. In the description of the present invention, the terms "rollback announcements" and "tokens" are used interchangeably.

Virtual time and SV in the present invention are related. The timestamp in the $i^{th}$ entry of $P_i$'s SV corresponds to the virtual time for $P_i$ at the given point in simulation. For example, let s.c denote the SV of $P_{s.p}$ in state s. The ordering between two SV c and d is defined in the present invention as follows.

$$c \leq d \equiv (\forall i: c[i] \leq d[i])$$

In $P_i$'s SV, the $j^{th}$ timestamp denotes the maximum virtual time of $P_j$ on which $P_i$ depends. This timestamp should not be greater than $P_j$'s own virtual time. Thus, the timestamp in the $i^{th}$ entry of the SV of a state of $P_i$ has the highest value among all the timestamps in this SV.

In the present invention, the protocol for distributed simulation is further described below. In addition to an SV, each LP also maintains an incarnation end table (iet). The virtual time of the straggler message that caused the roll back of a given incarnation of a given LP is added to the jet at each LP as the rollback announcement arrives. The jet then allows an LP to detect orphan messages.

When $P_i$ is ready for the next event, it acts on the message with the lowest virtual time. As explained previously, $P_i$ updates its SV and internal state, and possibly schedules events for itself and for other LPs by sending them messages.

Upon receiving a message m, $P_i$ discards m if it is an orphan message. This is the case when, for some j, $P_i$'s iet and the $j^{th}$ entry of m's SV indicate that m is dependent on a rolled back state of $P_j$. If $P_i$ detects that m is a straggler message with virtual time t, it broadcasts a rollback announcement containing t and increments its incarnation number, as shown above in Rollback( ) of Table 1. Thus, the rollback announcement basically indicates that any state of old incarnation with virtual time greater than t is an orphan state. Any state dependent on those orphan states is also orphan.

When an LP receives a rollback announcement containing virtual time t from $P_j$, it first checks for and discards all orphan messages in its input queue, then rolls back all states with the $j^{th}$ timestamp greater than t, and finally increments its incarnation number if it rolled back. The LP does not need to broadcast a rollback announcement, which is an important property of the present invention. This is possible because the transitive dependencies are maintained. As an example, if state w of $P_i$ is rolled back due to a token from $P_j$, then any state dependent on w must also be dependent on a rolled back state of $P_j$. Thus, the dependency will be detected as an orphan state when the rollback announcement from $P_j$ arrives, without the need for an additional rollback announcement from $P_i$. Detection of orphan messages occurs in a similar manner.

The complete protocol of the distributed simulation of the present invention follows in Table 2:

TABLE 2

```
LP P_i:
type entry = (int inc, int ts)
var sv : array [0..n-1] of entry; /* simulation vector */
    iet : array[0..n-1] of set of entry;
                    /* incarnation end table */
    token : entry;      /* rollback announcement */
Initialize:
    ∀ j : sv[j].inc = 0 ; sv[j].ts = -1 ;
    sv[i].ts = 0 ;
    ∀ j : iet[j] = {} ; /* empty set */
Receive_message(m):
    if ∃j, t : ((m.sv[j].inc,t) ∈ iet[j]) ∧ (t < m.sv[j].ts)
        then discard m ;
    else if m.ts < sv[i].ts then
            /* m is a straggler message */
token = (sv[i].inc,m.ts) ;
Broadcast(token) ;
    /* P_i receives its own broadcast and rolls back. */
Block till all LPs acknowledge broadcast ;
Execute_message:
    m = messages with the lowest value of m.ts ;
    ∀j: sv[j] = max(sv[j], m.sv[j]) ;
    sv[i].ts = m.ts ;
    Act on the event scheduled by m ;
Receive_token(v,t) from P_j ;
    Send acknowledgment;
    iet[j] = iet[j] ∪ {(v,t)} ;
    ∀m ∈ input_queue :
    if(m.sv[j].inc = v) ∧ (t < m.sv[j].ts)
        then discard m ;
    if(sv[j].inc = v) ∧ (t < sv[j].ts)
        then Rollback(j, (v, t));
Rollback(j, (v,t)) :
    Save the iet ;
    Restore the latest state s such that
        sv[j] ≤ (v,t) ...(C1)
    Discard the states that follow s ;
    Restore the saved iet ; sv[i].inc + + ;
```

To accomplish the objectives, an LP must block its execution after broadcasting a rollback announcement until it receives acknowledgments from all the other LPs. This ensures that a rollback announcement for a lower incarnation of $P_j$ reaches all LPs before they can become dependent on any higher incarnation of $P_j$. This greatly simplifies the design because, when a dependency entry is overwritten by an entry from a higher incarnation in the lexicographical maximum operation, it is guaranteed that no future roll back can occur due to the overwritten entry (as the corresponding rollback announcement must have arrived).

Specifically, if state u of $P_i$ is rolled back due to the arrival of a straggler, the simulation is correct if all the states that are dependent on u are also rolled back.

As previously described, the routine Rollback( ) of Table 2 is called from two places: Receive_message( ) and Receive_token( ) of Table 2. States that are rolled back in a call from Receive_message( ) are rolled back due to a straggler message. Suppose for example that $P_i$ receives a straggler message and u is one of the states of $P_i$ that are rolled back due to this straggler message. In the call from routine Receive_token( ), any state w not satisfying condition (I) is rolled back. Since the virtual time of u is greater than the virtual time of the straggler, any state w dependent on u will not satisfy condition (I). As a result, no state can become dependent on u because any message causing such dependency is discarded: if the message arrives after the rollback announcement, the message is discarded by the first test in the routine Receive_message( ) of Table 2; if the message arrives before the rollback announcement, there are two possible cases. 1) the message is discarded by the first test in the routine Receive_token( ), assuming the LP has not acted on the message; or 2) if the LP has acted on the message, the LP simply rolls back.

Figure 4:
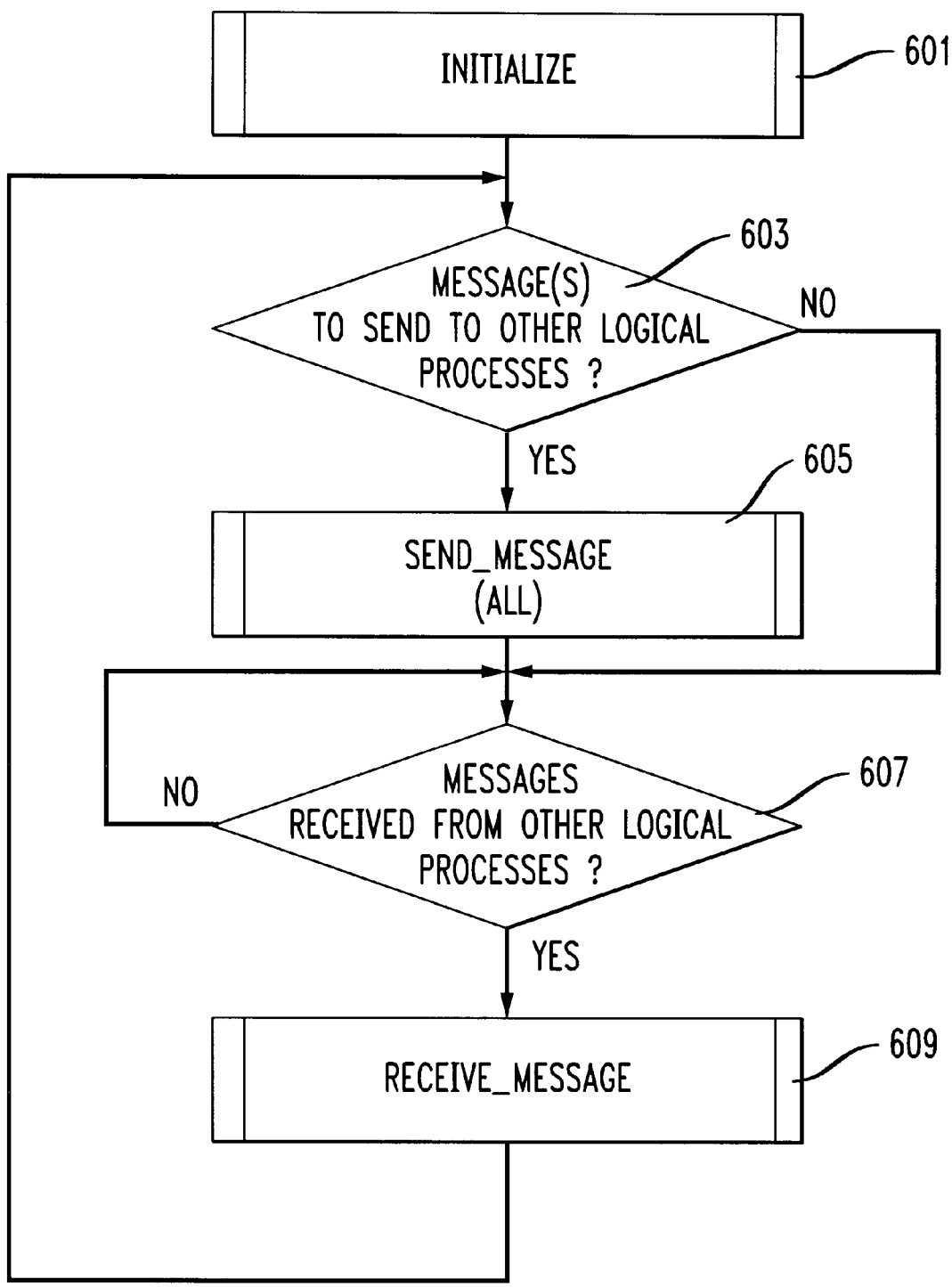
FIG. 4 is an illustration of a main logic flow according to the present invention.

The embodiment of the present invention as described above can be described through a series of example flow charts, as contained in FIGS. 4 through 15 Referring first to FIG. 4, a main process flow is illustrated. After initialization 601 of the various tables and values, the method first considers whether an LP has any outgoing messages that are to be transmitted to other LPs 603, and handles those messages according to the Send_messages module 605. If no message are ready for transmission to other LPs, the invention next considers whether an LP has messages received from other LPs 607, and handles those incoming messages according to the Receive_message module 609. In the absence of any irregularities in the Send_message or Receive_message modules, this process continues through out the simulation.

Figure 5:
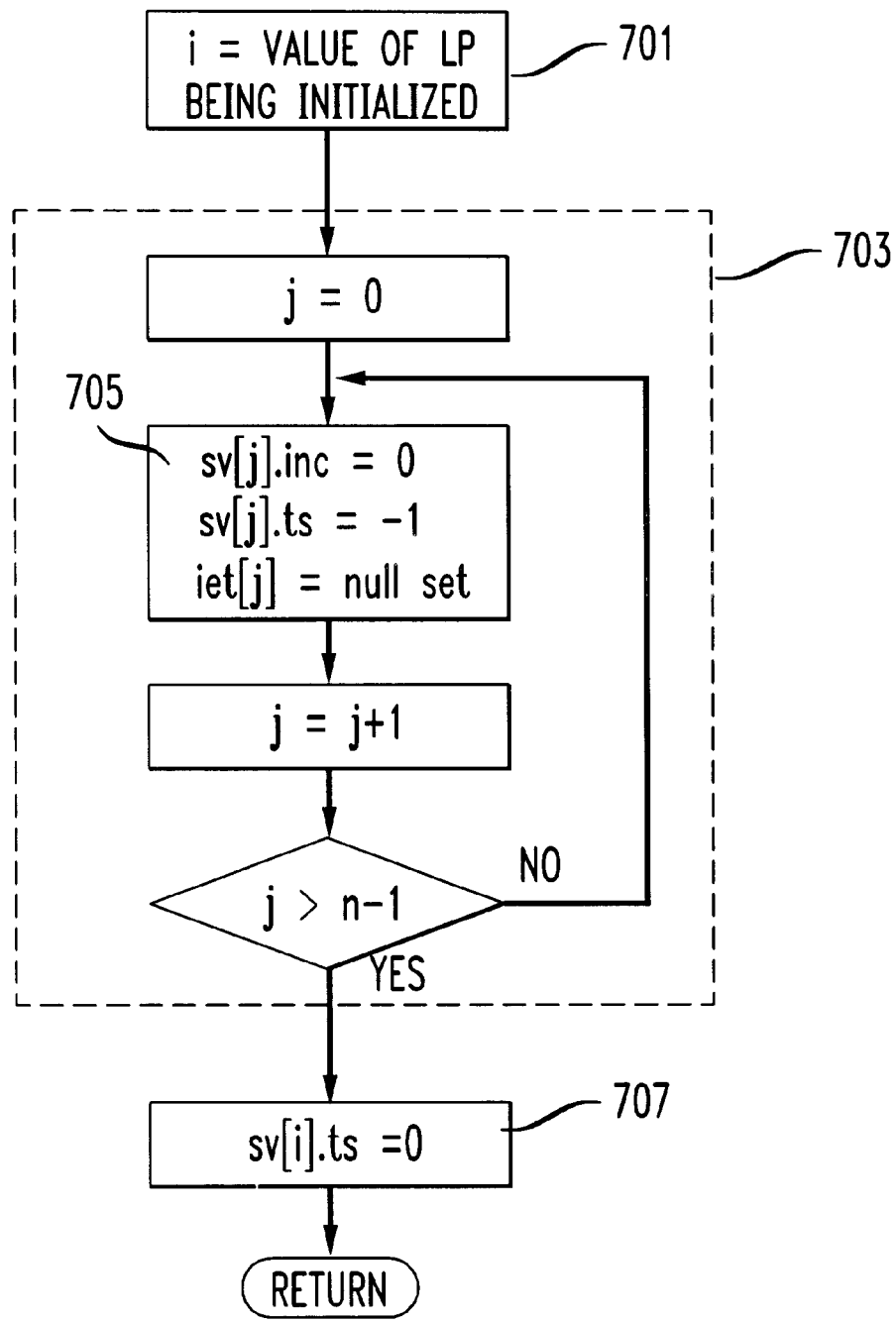
FIG. 5 is an illustration of an initialization routine according to the present invention.

Referring now to FIG. 5, the Initialize module used for each LP is illustrated. The variable i refers to the particular LP that is being initialized 701. For example, if this initialize module is being executed for LP3, then i will be set to 3 and any value where I=3 would refer to LP3. The initialize module establishes a loop 703 for all LPs, where n is the total number of LPs. In this loop, the values of the simulation vector corresponding to incarnation number are set to 0, the values corresponding to time stamp are set to −1 and the incarnation number end table values are set to the null set 705.

Then, the time stamp values are set to 0 for the vector entries that correspond to the particular LP that is being initialized 707.

Figure 6:
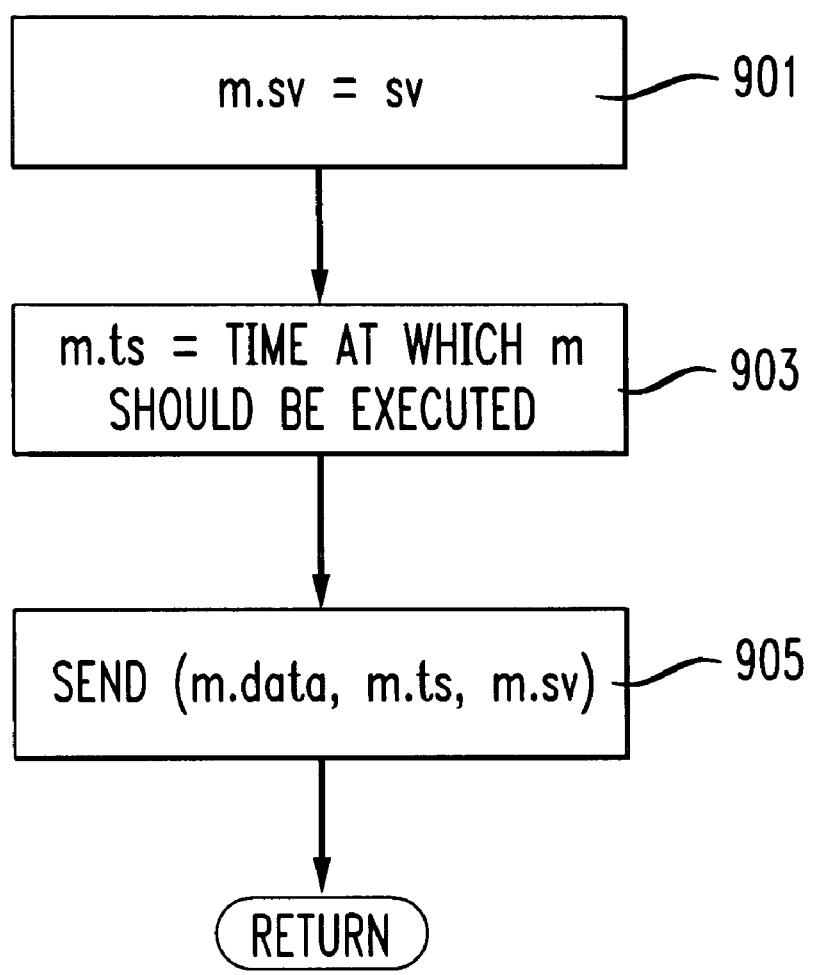
FIG. 6 is an illustration of a send message routine according to the present invention.

Referring now to FIG. 6, the Send_message module is illustrated. When an LP has a message to be transmitted to another LP, the simulation vector of the sending LP is copied to the message simulation vector 901. The time for execution of the message is then assigned to the message time stamp 903. Finally, the message simulation vector and message time stamp are appended to the message data, and transmitted to the other LP 905.

Figure 7:
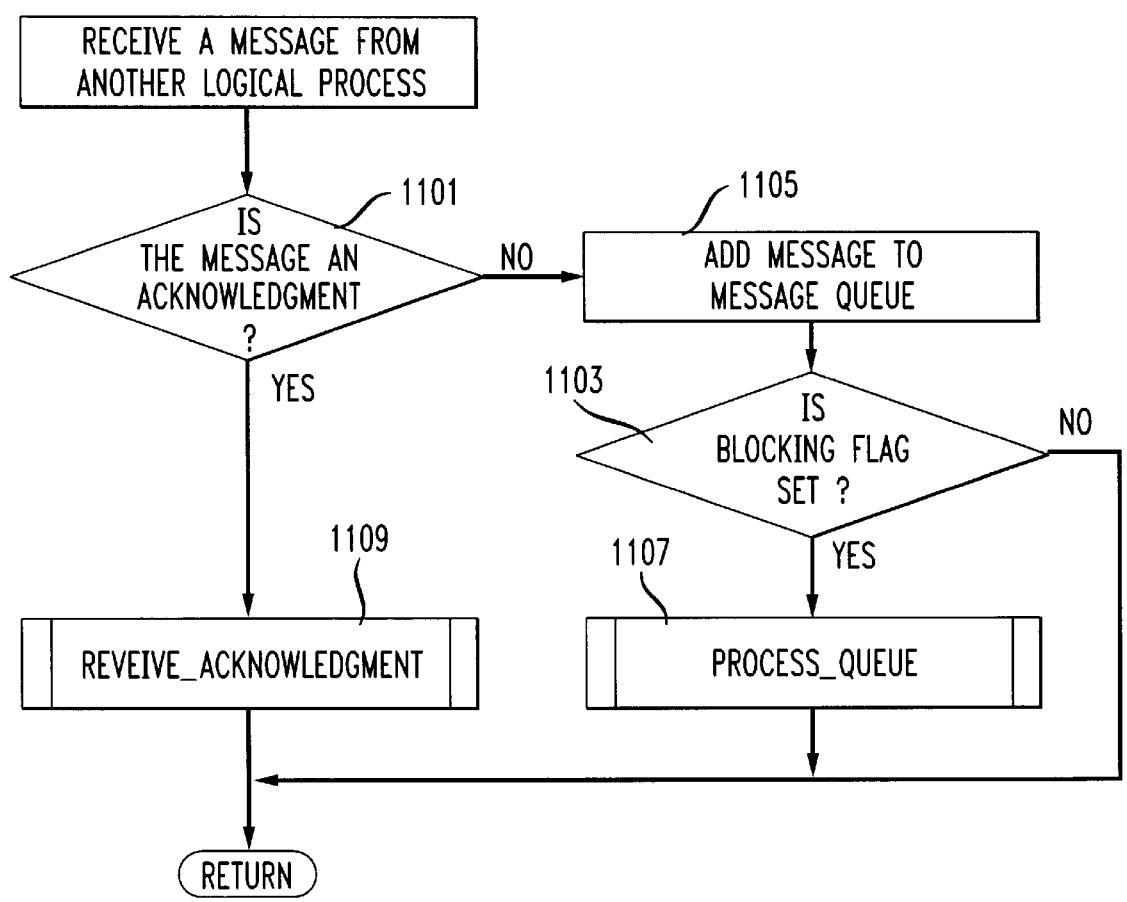
FIG. 7 is an illustration of a receive message routine according to the present invention.

Referring now to FIG. 7, when there is indication that a message has been received from another LP, the Receive_message module first determines whether the received message is an acknowledgment from another LP 1101. This is necessary because, after a rollback announcement has been broadcast, the sending LP must block until all other LPs have acknowledged receipt. If the message is not an acknowledgment, the blocking flag is checked 1103, and if blocking is still set, the message will be added to the message queue 1105, but will not be immediately processed. If the blocking flag is not set, the message will be processed according to the Process_queue module 1107. If the message was an acknowledgment, it is processed in the Receive_acknowledgment module 1109.

Figure 8:
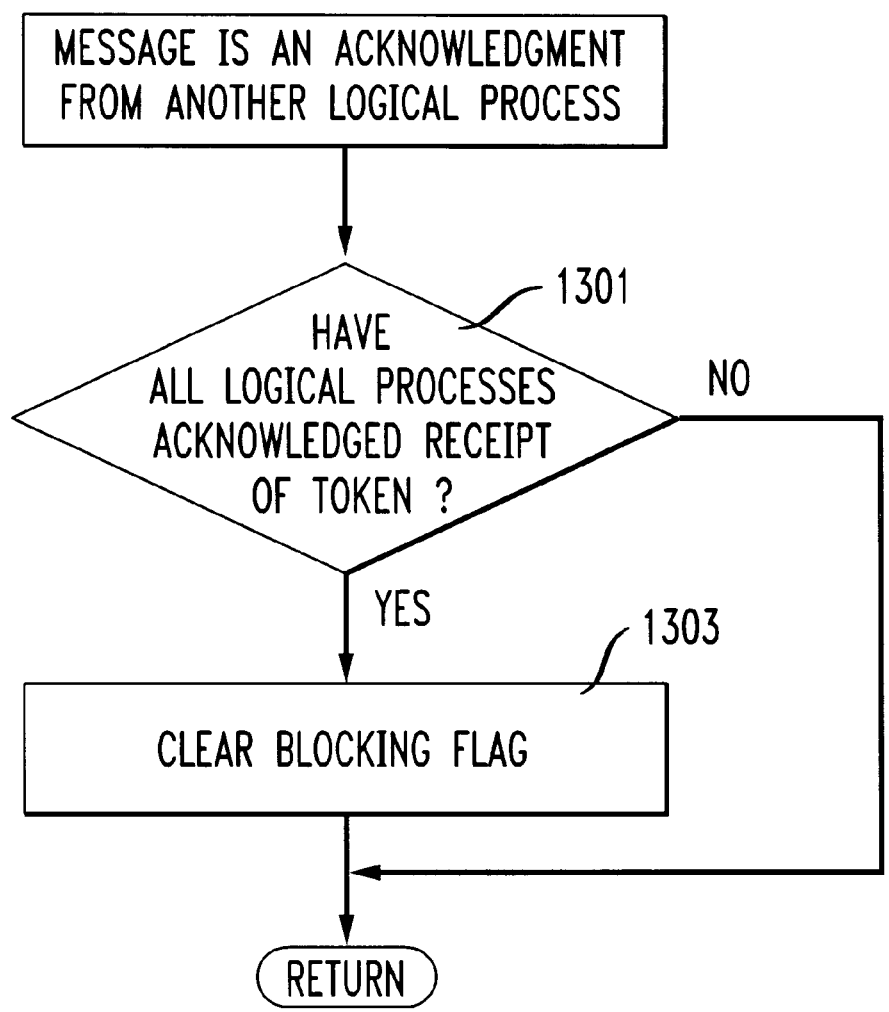
FIG. 8 is an illustration of an acknowledgment routine according to the present invention.

Referring to FIG. 8, the Receive_acknowledgment module is illustrated. An acknowledgment from another LP will arrive if an LP has previously sent a rollback announcement. After sending a rollback announcement, the broadcasting LP must block until all other LPs acknowledge the rollback announcement. This is first checked 1301, and if all LPs have acknowledged, the blocking flag that was previously set is cleared 1303. If all LPs have not yet responded, the broadcasting LP remains blocked.

Figure 9:
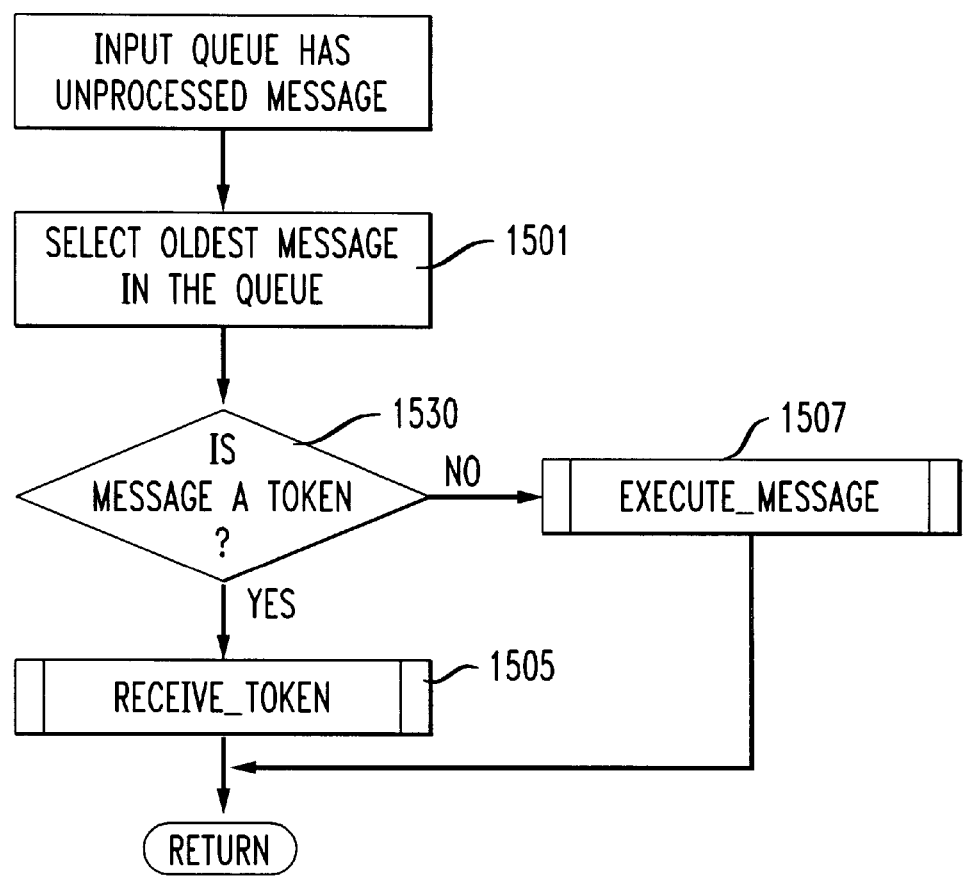
FIG. 9 is an illustration of a message queue process routine according to the present invention.

Referring now to FIG. 9, the Process_queue module is illustrated. At this point, it has been determined that the received message is not an acknowledgment from another LP, and the blocking flag is not set. Therefore the LP may select the oldest or earliest message in the queue 1501, and then determine whether it is a token, or rollback announcement 1503. Recall that the terms token and rollback announcement are used interchangeably. If the message is a token, it is executed according to the Receive_token module 1505, otherwise, the message is executed normally by the Execute_message module 1507.

Figure 10:
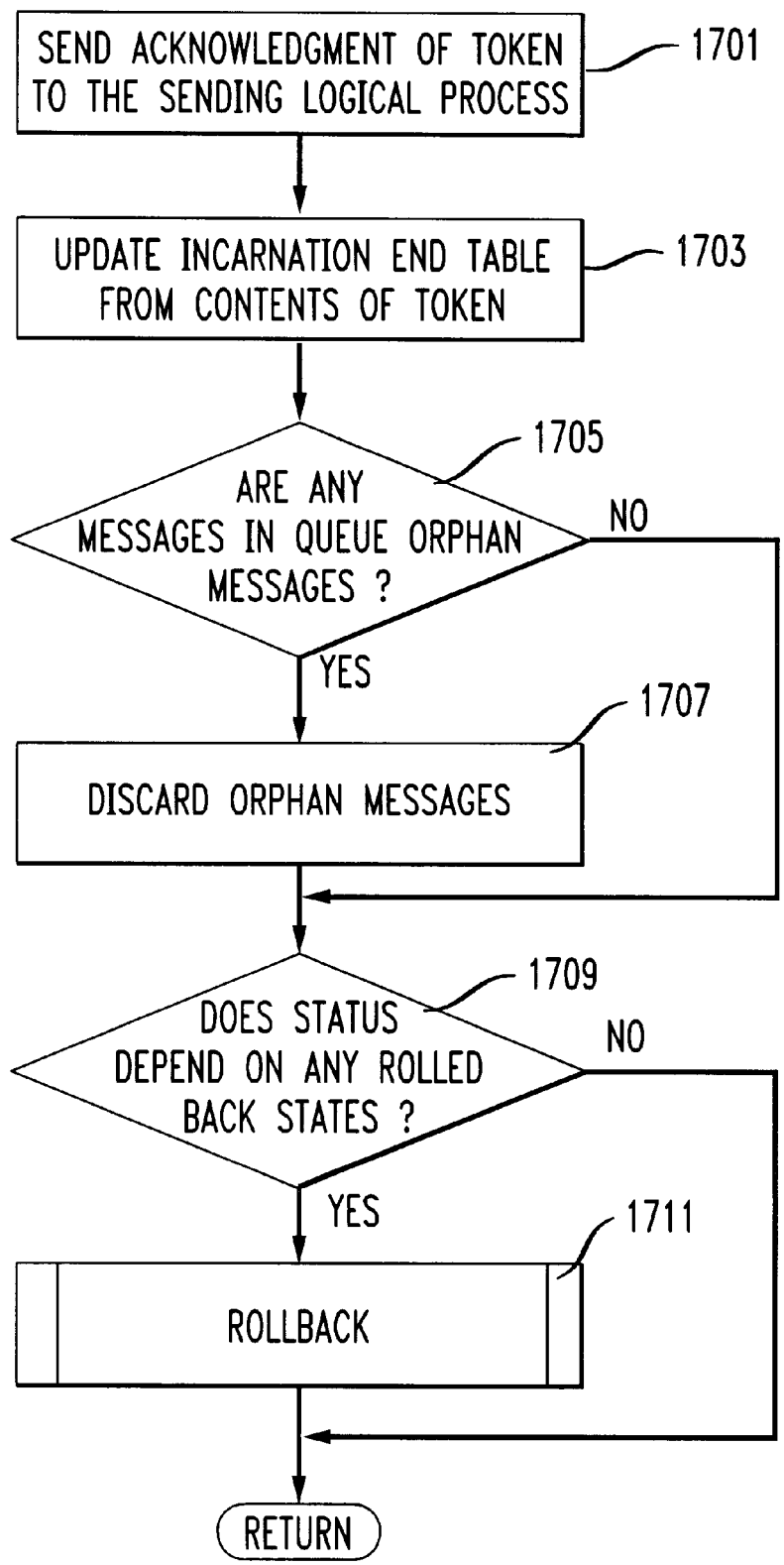
FIG. 10 is an illustration of a rollback announcement process routine according to the present invention.

Referring now to FIG. 10, the Receive_token module is illustrated. The received message has now been determined to be a token, or rollback announcement. The receiving LP first sends an acknowledgment 1701, and then updates its own incarnation end table using the contents of the token 1703. Next, the receiving LP determines whether any of the messages in the message queue are orphan messages as a result of the roll back 1705, and if so, they are discarded 1707. The receiving LP next determines whether it is dependent on any rolled back states 1709. If so, it must roll back 1711. Otherwise, the receiving LP has no further action required.

Figure 11:
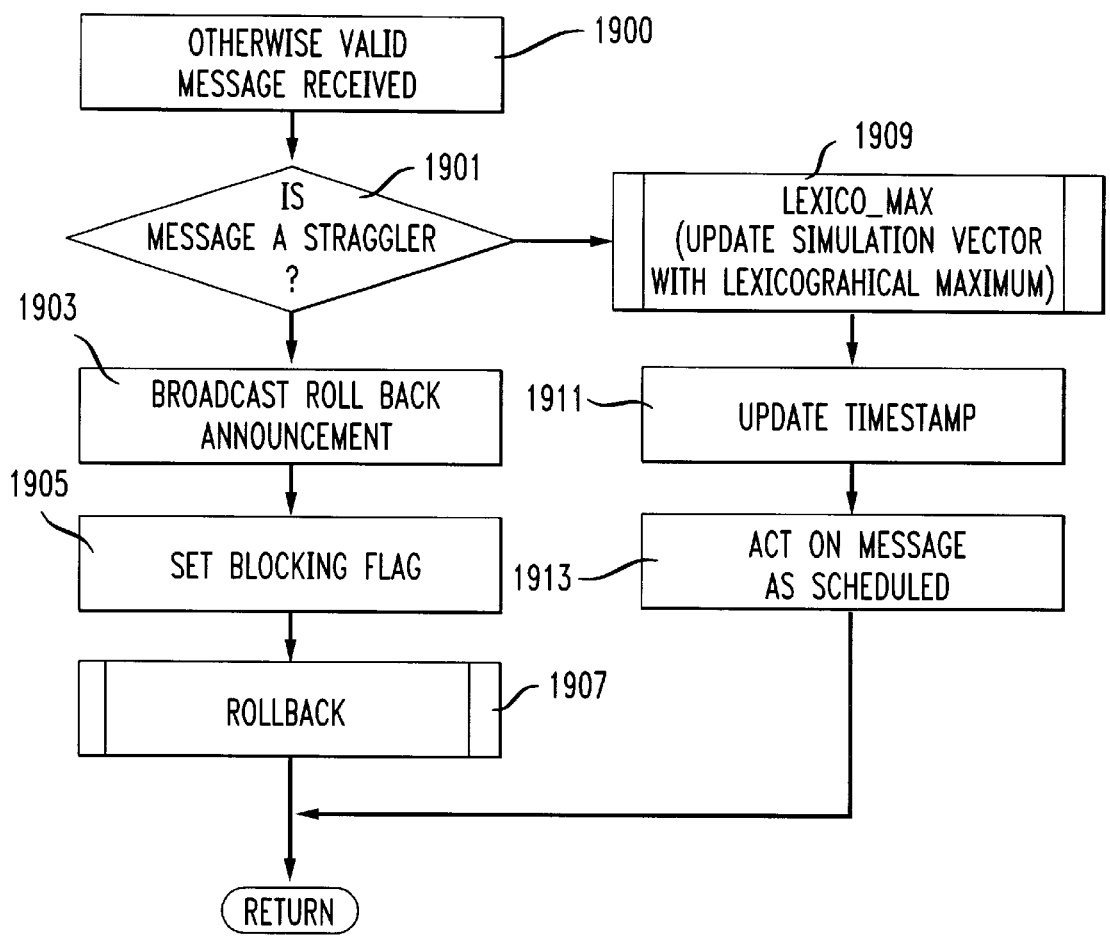
FIG. 11 is an illustration of a message execution routine according to the present invention.

Referring to FIG. 11, the Execute_message module is illustrated. The message at this point 1900 is known to be not an acknowledgment, or a token (rollback announcement). Therefore it is either a valid message, or a straggler message. The first test makes that determination 1901. If a straggler, the affected LP first broadcasts a token (rollback announcement) 1903, and then sets a blocking flag 1905 for itself to prevent execution of other messages from other LPs until all have acknowledged receipt of the rollback announcement. Finally, the affected LP rolls back according to the Roll back module 1907. If the received message is determined not to be a straggler, it is processed normally. First, a lexicographical maximum is taken, according to the Lexico_max module 1909. Then the local timestamp is updated 1911, and the message is executed as scheduled 1913.

Figure 12:
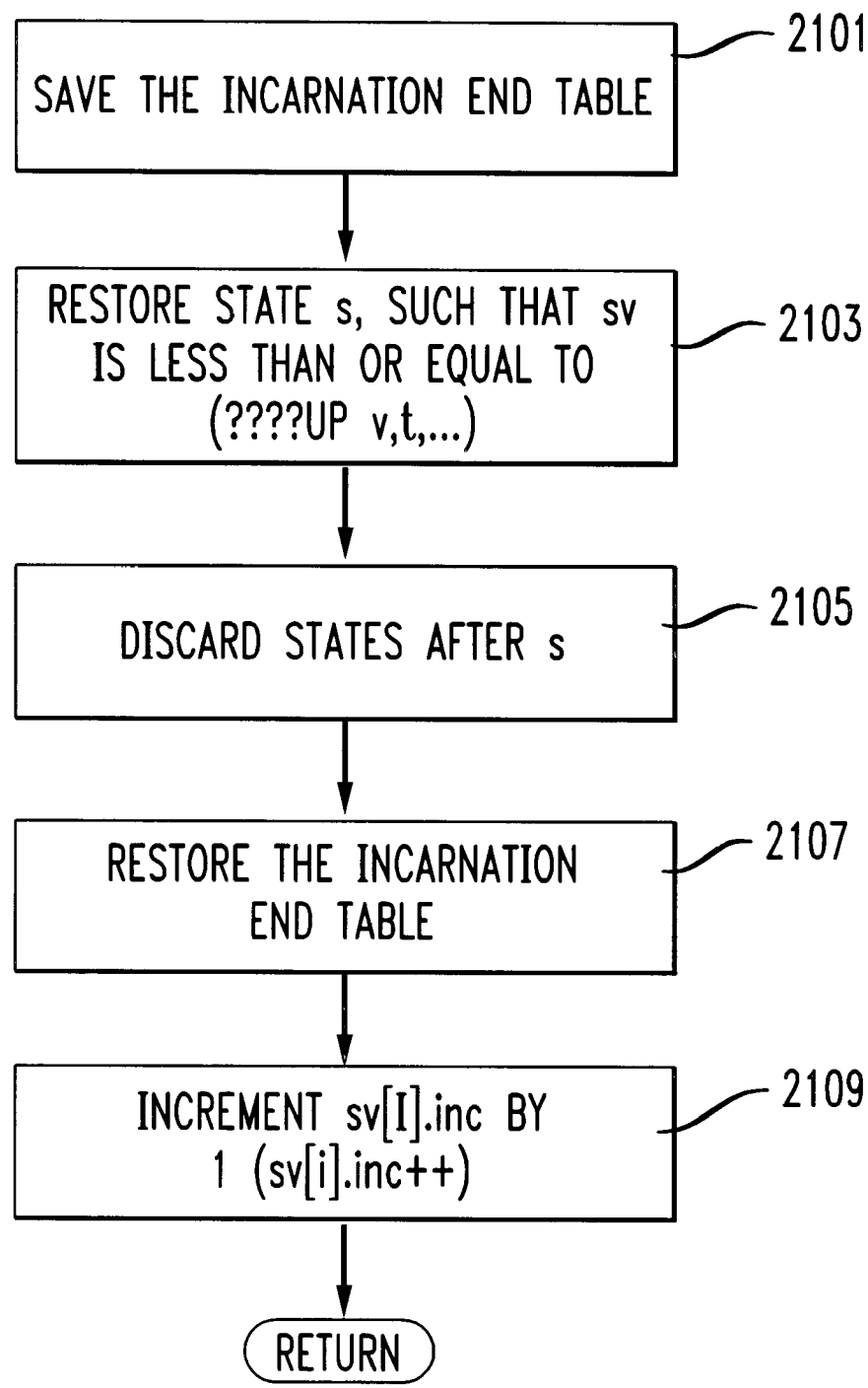
FIG. 12 is an illustration of a roll back routine according to the present invention.

Referring to FIG. 12, the Roll back module is illustrated. This module may be called from either the affected LP, or by an LP that determines it is transitively dependent on a rolled back state. The first step is to save the incarnation end table 2101, then restore the simulation state, such that the simulation time will accommodate the straggler message 2103. Then, all later states are discarded as irrelevant 2105, and the incarnation end table is restored 2107. Finally, the incarnation number is incremented by one to reflect the roll back 2109.

Figure 13:
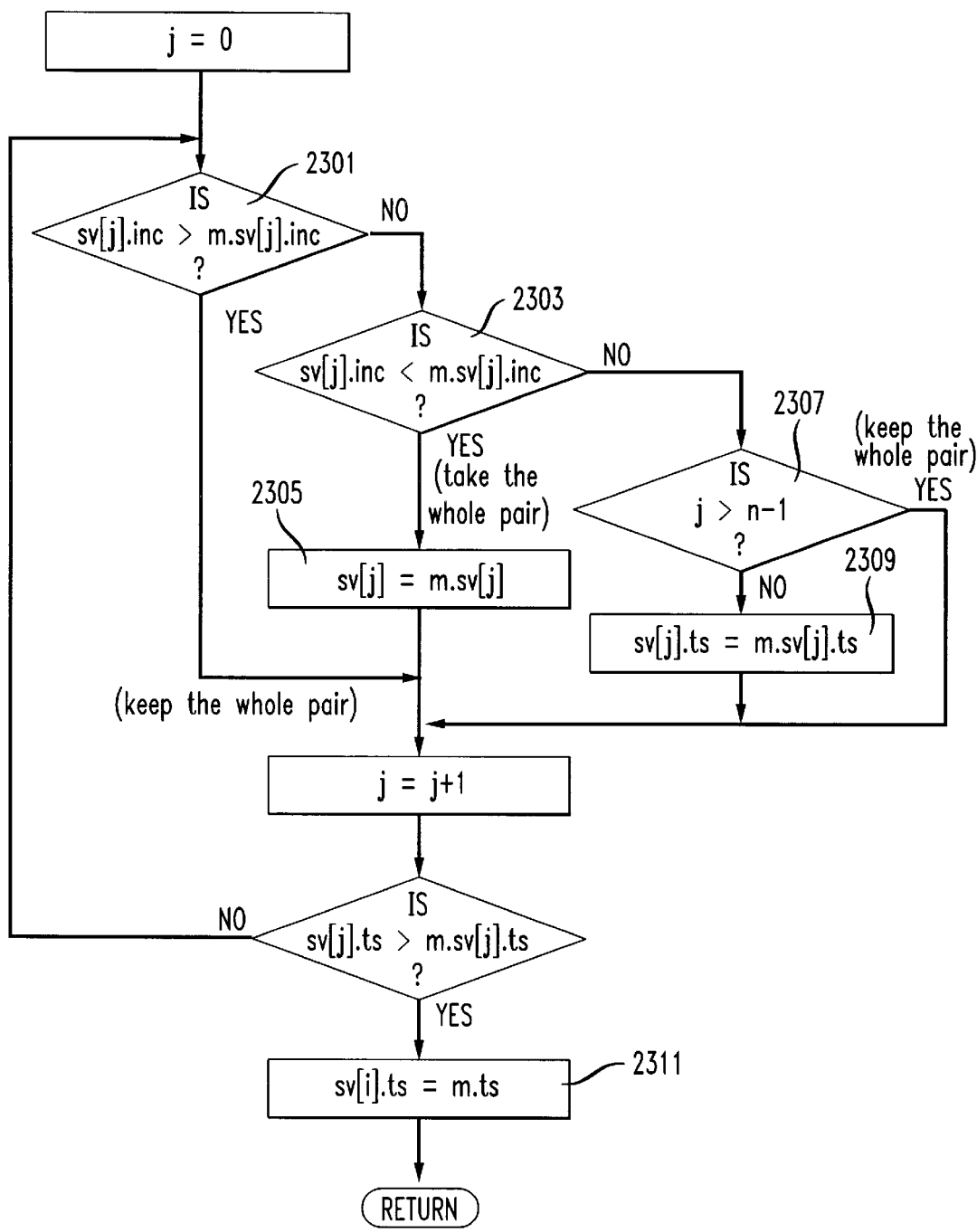
FIG. 13 is an illustration of a lexicographical maximum routine according to the present invention.

Referring to FIG. 13, the Lexico_max module is illustrated. In this module, the incarnation numbers for an entry are first compared 2301. If the local incarnation number is greater, the local vector is retained unchanged. If the local incarnation number is less 2303, the local simulation vector is replaced with the message simulation vector 2305. If the incarnation numbers are both the same, the time stamps are then compared 2307. If the local time stamp is greater than the message time stamp, the local vector is retained unchanged. Otherwise, the local timestamp is replaced with the message timestamp 2309. This process is repeated for the entire simulation vector. Finally, the message timestamp corresponding to the receiving LP is updated with the message timestamp 2311.

Figure 14:
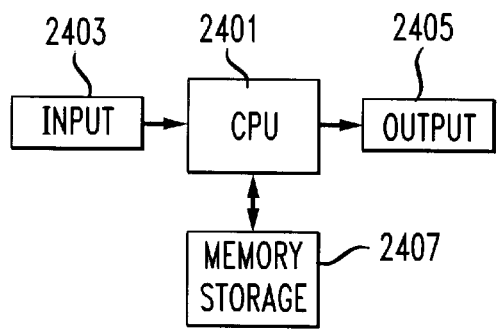
FIG. 14 is an illustration of a single computer system according to the present invention.

The method described above may be implemented in a number of different system configurations. Referring to FIG. 14, a distributed simulation system according to the present invention may be implemented on a single computer with a central processor unit (CPU) 2401 that is capable of running multiple discrete simulation events in time warp, with interaction between the logical processes within the CPU. To provide full functionality, the system also provides ports for input 2403 and output 2405, in addition to memory storage 2407 that may hold the simulation code, as well as input and output variables. Though the example has used a traditional computer with discrete CPU, input, output and storage, this is not limiting. Any form of computational device which is capable of executing instructions based on a set of input variables and producing a resulting output is suitable to the present invention.

Figure 15:
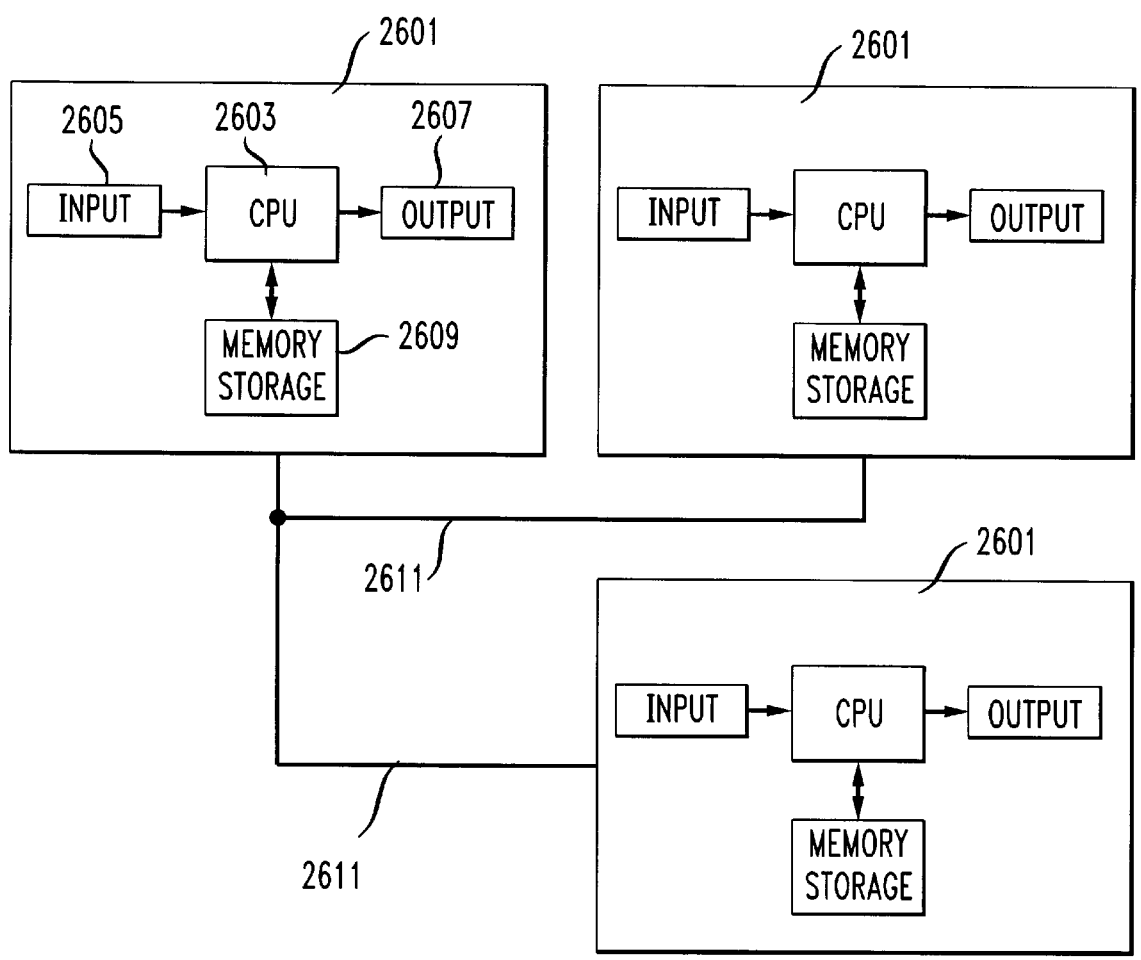
FIG. 15 is an illustration of a multiple computer system according to the present invention.

The method described may also be implemented in a system of distributed simulation where different logical processes run on discrete computers. Referring to FIG. 15, this configuration is illustrated. Here, a number of individual computers 2601, each with a CPU 2603, input 2605, output 2607 and memory storage 2609, are appropriately interconnected with each other 2611, so that messages and interaction may be exchanged between the individual computers and logical processes. The interconnection may be any type customarily used to interconnect individual computers, including local area networks, wide area networks, internets and intranets. The interconnections may also be provided by telephone line using a modem. Any interconnection means is suitable if it allows for message exchange of information between the individual computers.

Alternative Embodiments

Figure 3:
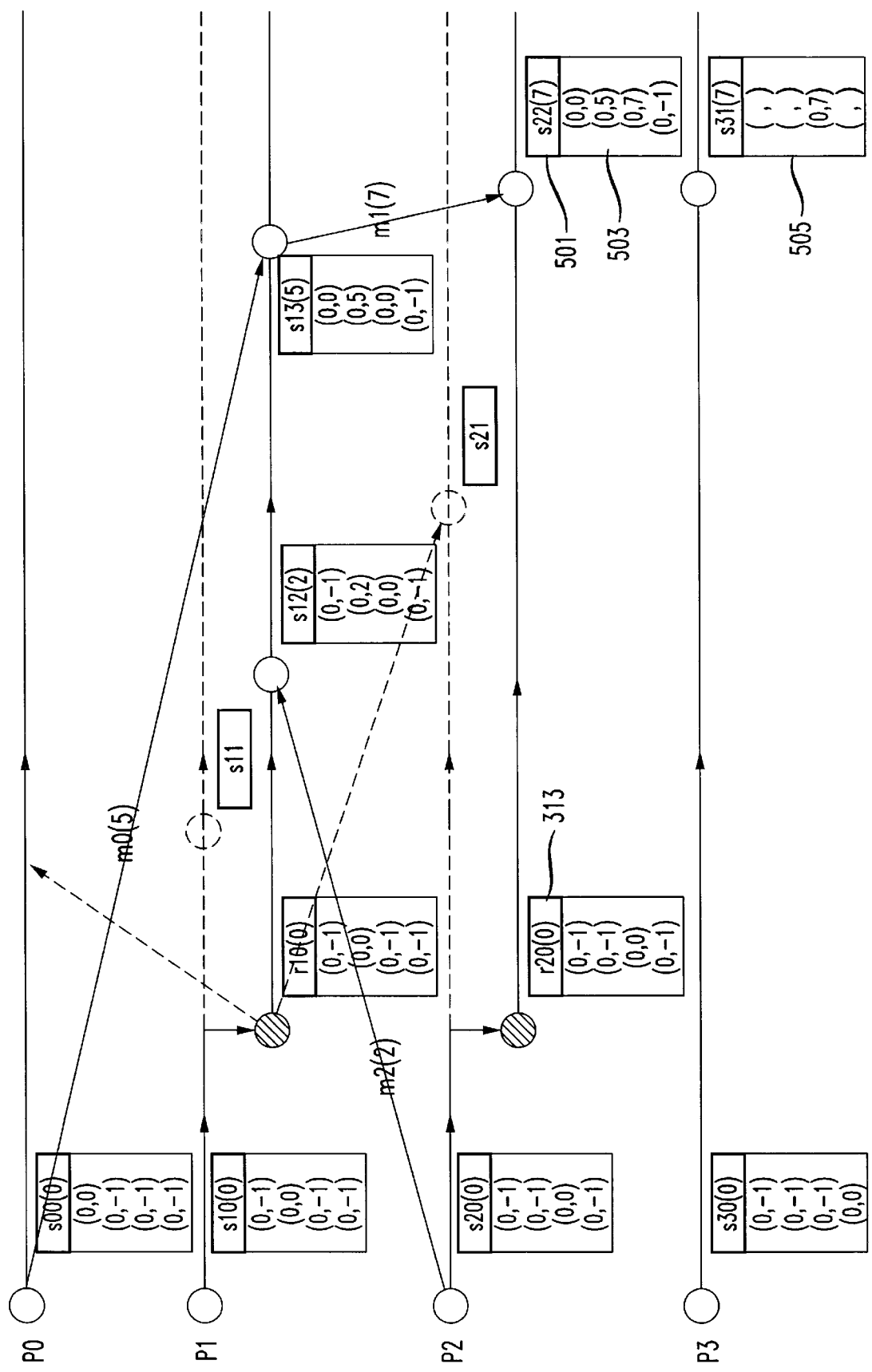
FIG. 3 is an alternative embodiment of the Post-straggler message computation in a distributed simulation according to the present invention.

For systems with a large number of LP's, the message overhead due to transmission of an SV with each message may be high and the delay due to the blocking can be substantial. One alternative aspect of the present invention is reduction of the message transmission overhead due to the appended SV. Accomplishing this aspect occurs through reduction of the blocking and also through reduction of the SV size. In the previous description of the protocol, the incarnation number at the LP receiving the rollback announcement was incremented upon a roll back due to a rollback announcement, though another rollback announcement was not broadcast. The protocol still works even if the incarnation number at the LP receiving the rollback announcement is not incremented. In this first alternative embodiment of the present invention, using FIG. 3 to illustrate, P2 executes an event and makes a state transition from r20 313 to s22 501. If P2 does not increment its incarnation number on rolling back due to the rollback announcement from P1, then s22 will have (0, 7) as the 3rd entry in its SV 503, which is the same as s21's 3rd entry 117 in FIG. 1. If in addition, the 3rd entry of a state w of another LP P3 is (0, 7) 505, there must be a way to determine whether P3 is dependent on s21, which is rolled back, or s22, which is not rolled back. This is readily accomplished because if w is dependent on s21, its orphan status will be identified by the 2nd entry (0, 5), without relying on the 3rd entry.

This first alternative embodiment of the present invention ensures that, for every new incarnation, a rollback announcement is broadcast and so every LP will have an iet entry for it. This allows the following optimization technique for reducing the blocking. When $P_i$ receives a straggler message and broadcasts a rollback announcement, instead of requiring $P_i$ to block until it receives all acknowledgments, we simply allow $P_i$ to continue its execution in the new incarnation. A difficulty remains in that dependencies on the new incarnation may reach an LP $P_j$ (through a chain of messages) before the rollback announcement does. If $P_j$ has a dependency entry on the old incarnation and should be identified as an orphan state when the token arrives, overwriting the old entry with the new entry via the lexicographical maximum operation results in undetected orphans and hence incorrect simulation. The solution is to force $P_j$ to block for the rollback announcement before acquiring any dependency on the new incarnation. This blocking is a great improvement over the original blocking if the number of LPs (and hence acknowledgments) is large but the message activity is not too high.

A second alternative embodiment of the present invention addresses the other aspect of reducing the size of the simulation vectors (SVs). Global Virtual Time (GVT) is the virtual time at a given point in simulation such that no LP will ever roll back to a time earlier than GVT. It is the minimum of the virtual times of all LPs and all the messages in transit at the given instant. Algorithms to compute GVT are known in the art. To reduce the size of simulation vectors, any entry that has a timestamp less than the GVT can be set to NULL, and NULL entries need not be transmitted with the message. This does not affect the correctness of simulation because: (1) the virtual time of any message must be greater than or equal to the GVT, and so timestamps less than the GVT are never useful for detecting stragglers; and (2) the virtual time contained in any rollback announcement must be greater than or equal to the GVT, and so timestamps less than the GVT are never useful for detecting orphans. Since most of the SV entries are initialized to $-1$ which must be less than GVT, this optimization allows a simulation to start with very small vectors, and is particularly effective if there is high locality in message activities.

Another approach in this second embodiment of the present invention to reduce the size of the SV is to divide the LPs into clusters. A few of the possible designs are described. If the interaction inside a cluster is optimistic, while inter-cluster messages are sent conservatively, independent SV's can be used inside each cluster, involving only the LPs in the cluster. If intra-cluster execution is sequential, while inter-cluster execution is optimistic, SV's can be used for inter-cluster messages with one entry per cluster. Similarly, one can use a scheme where inter-cluster and intra-cluster executions are both optimistic but employ different simulation vectors. This can be further generalized to a hierarchy of clusters and simulation vectors. In general, however, inter-cluster simulation vectors introduce false dependencies which may result in unnecessary roll backs. It is therefore a trade-off between the size of the simulation vectors and unnecessary roll backs.

What is claimed is:

1. A method for performing event driven simulation between logical processes by sending and receiving messages between the logical processes to advance a simulation state of the logical processes based on the messages, the method comprising:

maintaining a log at each said logical process, said log including past rollback information on each said logical process;

appending rollback information from said log to each of said messages;

broadcasting a rollback message from a receiving logical process; and correcting the state of at least one of said logical processes other than said receiving logical process based on said log and said rollback message.

2. The method of claim 1, wherein the event driven simulation is an event driven distributed simulation.

3. The method of claim 1, further comprising:

identifying a straggler message.

4. The method of claim 3, wherein identifying a straggler message further comprises:

comparing a timestamp appended to an incoming message and a virtual time of a receiving logical process; and identifying said incoming message as a straggler message if said virtual time is greater than said timestamp.

5. The method of claim 1, further comprising:

correcting the state of said receiving logical process.

6. The method of claim 5, wherein correcting the state of said receiving logical process further comprises:

saving an incarnation end table;

restoring said receiving logical process to a last valid state;

discarding simulation states that are no longer relevant;

restoring said saved incarnation end table; and processing said straggler message.

7. The method of claim 1, further comprising:

identifying a suspect message as an orphan message; and discarding said orphan message.

8. The method of claim 1, further comprising:

resuming the simulation.

9. The method of claim 1, wherein said log further comprises:

simulation state information on each said logical process.

10. The method of claim 1, wherein said log further comprises a simulation vector, comprising a timestamp entry and an incarnation number entry for each said logical process, and an incarnation end table, with entries comprising an incarnation number and a timestamp entry of a straggler message that caused a rollback, and maintaining a log further comprises:

maintaining simulation vector entries; and maintaining entries in said incarnation end table.

11. The method of claim 10, further comprising:

setting any timestamp entry to NULL if said timestamp would be less than a Global Virtual Time; and eliminating NULL entries from said messages, where said Global Virtual Time is a minimum virtual time of said logical processes and said messages in transit.

12. The method of claim 1, wherein appending rollback information from said log further comprises:

appending a simulation vector to each of said messages.

13. The method of claim 1, wherein said rollback message further comprises a timestamp of a straggler message and an incarnation number from said receiving logical process and broadcasting a rollback message further comprises:

blocking advancement of the simulation state of said receiving logical process until all other of said logical processes acknowledge receipt of said rollback message.

14. The method of claim 1, wherein said rollback message further comprises a timestamp of a straggler message and an incarnation number from said receiving logical process, and broadcasting a rollback message further comprises:

identifying another logical process of said logical processes as depending on a rolled back state;

blocking advancement of said another logical process;

saving an incarnation end table;

restoring said another logical process to a last valid state;

discarding simulation states that are no longer relevant;

restoring said saved incarnation end table; and unblocking advancement of said another logical process.

15. The method of claim 1, wherein the step of correcting the state of at least one of said logical processes other than said receiving logical process further comprises:

identifying another logical process of said logical processes as depending on a rolled back state;

saving an incarnation end table;

restoring said another logical process to a last valid state;

discarding simulation states that are no longer relevant; and restoring said saved incarnation end table.

16. A method for performing event driven simulation between logical processes by sending and receiving messages between the logical processes to advance a simulation state of the logical processes based on the messages, the method comprising:

maintaining a log at each said logical process, said log including past rollback information on each said logical process;

creating clusters of said logical processes;

appending rollback information from said log to each of said intra-cluster messages, wherein said roll back information includes information from said logical processes within said cluster;

broadcasting a rollback message from a receiving logical process; and correcting the state of at least one of said logical processes other than said receiving logical process based on said log and said rollback message.

17. A method for performing event driven simulation between logical processes by sending and receiving messages between the logical processes to advance a simulation state of the logical processes based on the messages, the method comprising:

maintaining a log at each said logical process, said log including past rollback information on each said logical process;

creating clusters of said logical processes;

appending rollback information from said log to each of said inter-cluster messages, wherein said rollback information includes information from said logical processes within said cluster;

broadcasting a rollback message from a receiving logical process; and correcting the state of at least one of said logical processes other than said receiving logical process based on said log and said rollback message.

18. A system for performing event driven simulation between logical processes by sending and receiving messages between the logical processes to advance a simulation state of the logical processes based on the messages, the system comprising:

means for maintaining a log at each said logical process, wherein said log contains past rollback information on each said logical process;

means for appending rollback information from said log to each of said messages;

means for broadcasting a rollback message from a receiving logical process; and means for correcting the state of at least one of said logical processes other than said receiving logical process based on said log and said rollback message.

19. The system of claim 18, wherein the event driven simulation is an event driven distributed simulation.

20. The system of claim 18, further comprising:

means for identifying a straggler message.

21. The system of claim 20, wherein means for identifying a straggler message further comprises:

means for comparing a timestamp appended to an incoming message and a virtual time of said receiving logical process; and means for identifying said incoming message as a straggler message if said virtual time is greater than said timestamp.

22. The system of claim 18, further comprising:

means for correcting the state of said receiving logical process.

23. The system of claim 22, wherein means for correcting the state of said receiving logical process further comprises:

means for saving an incarnation end table;

means for restoring said receiving logical process to a last valid state;

means for discarding simulation states that are no longer relevant;

means for restoring said saved incarnation end table; and means for processing said straggler message.

24. The system of claim 18, further comprising:

means for identifying a suspect message as an orphan message; and means for discarding said orphan message.

25. The system of claim 18, further comprising:

means for resuming the simulation.

26. The system of claim 18, wherein said log further comprises:

simulation state information on each said logical process.

27. The system of claim 18, wherein said log further comprises a simulation vector, comprising a timestamp entry and an incarnation number entry for each said logical process, and an incarnation end table, with entries comprising an incarnation number and a timestamp entry of a straggler message that caused a rollback, and means for maintaining a log further comprises:

means for maintaining simulation vector entries; and entries in said incarnation end table.

28. The system of claim 27, further comprising:

means for setting any timestamp entry to NULL if said timestamp would be less than a Global Virtual Time; and means for eliminating NULL entries from said messages, where said Global Virtual Time is a minimum virtual time of said logical processes and said messages in transit.

29. The system of claim 18, wherein means for appending rollback information from said log to each of said messages further comprises:

means for appending a simulation vector to said messages.

30. The system of claim 18, wherein said rollback message further comprises a timestamp of said straggler message and an incarnation number from said receiving logical process and means for broadcasting a rollback message further comprises:

means for blocking advancement of the simulation state of said receiving logical process until all other of said logical processes acknowledge receipt of said rollback message.

31. The system of claim 18, wherein said rollback message further comprises a timestamp of said straggler message and an incarnation number from said receiving logical process and means for broadcasting a rollback message further comprises:

means for identifying another logical process of said logical processes as depending on a rolled back state;

means for blocking advancement of said another logical process;

means for saving an incarnation end table;

means for restoring said another logical process to a last valid state;

means for discarding simulation states that are no longer relevant;

means for restoring said saved incarnation end table; and means for unblocking advancement of said another logical process.

32. The system of claim 18, wherein means for correcting the state of at least one of said logical processes other than said receiving logical process further comprises:

means for identifying another logical process of said logical processes as depending on a rolled back state;

means for saving an incarnation end table;

means for restoring said another logical process to a last valid state;

means for discarding simulation states that are no longer relevant; and means for restoring said saved incarnation end table.

33. A system for performing event driven simulation between logical processes by sending and receiving messages between the logical processes to advance a simulation state of the logical processes based on the messages, the system comprising:

means for creating clusters of said logical processes;

means for maintaining a log at each said logical process, wherein said log contains past rollback information on each said logical process;

means for appending rollback information from said log to each intra-cluster messages, wherein said rollback information includes information from said logical processes within said cluster;

means for broadcasting a rollback message from a receiving logical process; and means for correcting the state of at least one of said logical processes other than said receiving logical process based on said log and said rollback message.

34. A system for performing event driven simulation between logical processes by sending and receiving messages between the logical processes to advance a simulation state of the logical processes based on the messages, the system comprising:

means for creating clusters of logical processes;

means for maintaining a log at each said logical process, wherein said log contains past rollback information on each said logical process;

means for appending roll back information from said log to each inter-cluster messages, wherein said rollback information includes information from said logical processes within said cluster;

means for broadcasting a rollback message from a receiving logical process; and means for correcting the state of at least one of said logical processes other than said receiving logical process based on said log and said rollback message.

* * * * *